United States Patent
Choi et al.

(10) Patent No.: US 8,204,457 B2
(45) Date of Patent: Jun. 19, 2012

(54) MOBILE TRANSMITTER AND TRANSMITTING METHOD THEREOF

(75) Inventors: Byoung-Gun Choi, Daegu (KR); Seok-Bong Hyun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1086 days.

(21) Appl. No.: 12/111,878

(22) Filed: Apr. 29, 2008

(65) Prior Publication Data

US 2009/0061797 A1    Mar. 5, 2009

(30) Foreign Application Priority Data

Aug. 29, 2007    (KR) .......................... 10-2007-0087121

(51) Int. Cl.
*H03C 1/62* (2006.01)
*H04B 17/00* (2006.01)
(52) U.S. Cl. .................. 455/115.3; 455/108; 455/115.1
(58) Field of Classification Search .......... 455/110–113, 455/108–109, 115.1, 115.3, 127.1, 127.5, 455/129

See application file for complete search history.

(56) References Cited

U.S. PATENT DOCUMENTS

| 6,892,057 | B2 | 5/2005 | Nilsson |
| 7,197,086 | B2 | 3/2007 | Rauh et al. |
| 7,209,526 | B2 | 4/2007 | Kim et al. |
| 2006/0145758 | A1 | 7/2006 | Klomsdorf et al. |
| 2007/0014381 | A1 | 1/2007 | Rozenblit et al. |
| 2007/0014382 | A1* | 1/2007 | Shakeshaft et al. ........... 375/297 |

FOREIGN PATENT DOCUMENTS

| JP | 2004-289812 | 10/2004 |
| JP | 2005-244935 | 9/2005 |
| JP | 2007-189438 | 7/2007 |

* cited by examiner

*Primary Examiner* — Christian Hannon

(57) ABSTRACT

Provided is a mobile transmitter and a transmitting method thereof. The mobile transmitter includes a transmission circuit and a control circuit. The transmission circuit selectively operates as a polar transmitter or a direct-conversion transmitter. The control circuit controls an operation of the transmission circuit based on the level of an output signal. The mobile transmitter operates as a direct-conversion transmitter using a linear power amplifier with a high dynamic range when it transmits a low-power signal. Also, the mobile transmitter operates as a polar transmitter using a switching power amplifier with a high power efficiency when it transmits a medium-power or high-power signal. Thus, the mobile transmitter according to the present invention can provide both the high power efficiency (i.e., the advantage of the switching power amplifier) and the high dynamic range (i.e., the advantage of the linear power amplifier). Consequently, it possible to increase the battery lifetime of a personal portable communication terminal and also to implement to a compound terminal that can satisfy a variety of communication standards with a high dynamic range.

18 Claims, 4 Drawing Sheets

MOBILE TRANSMITTER AND TRANSMITTING METHOD THEREOF

CROSS-REFERENCE TO RELATED APPLICATIONS

This U.S. non-provisional patent application claims priority under 35 U.S.C. §119 of Korean Patent Application No. 10-2007-87121, filed on Aug. 29, 2007, the entire contents of which are hereby incorporated by reference.

BACKGROUND OF THE INVENTION

The present invention disclosed herein relates to a mobile transmitter, and more particularly, to a mobile transmitter capable of operating in at least two transmit (TX) modes and a transmitting method thereof.

The present invention has been derived from a research undertaken as a part of IT R & D program of the Ministry of Information and Communication and Institution of Information Technology Association (MIC/IITA) [2005-S-017-03], Integrated development of ultra low power RF/HW/SW SoC.

The requirements of a mobile terminal include a low power, a low price, a small size, a high data rate, and a soft defined radio (SDR) function. In terms of power amplifier design, the use of a complementary metal-oxide semiconductor (CMOS) process is preferable to the use of a GaAs process for achievement of the small size and the low price. Also, in the mobile terminal, the number of external SMT (surface mounting technology) components need be reduced and as many components as possible need be built in a main RF (radio frequency) chip.

A high-linearity power amplifier is required for design of a high-data-rate transmitter. However, because a CMOS power amplifier has a lower linearity than a GaAs power amplifier, it is necessary to provide transmission structures for addressing the lower linearity of the CMOS power amplifier. One of such transmission structures is a polar transmitter. An example of the polar transmitter is disclosed in U.S. Pat. No. 6,892,057 entitled "METHOD AND APPARATUS FOR REDUCING DYNAMIC RANGE OF A POWER AMPLIFIER" and issued to Nilsson et al. on May 10, 2005.

In general, a polar transmitter processes an amplitude signal R(t) and a phase signal θ(t) in a separate manner. For example, the amplitude signal is input to a bias circuit of a switching power amplifier in the polar transmitter, while the phase signal is input to a signal input unit of the switching power amplifier. Thereafter, the amplitude signal and the phase signal are amplified and combined by the switching power amplifier. The maximum range of the amplitude signal input to the bias circuit of the switching power amplifier is limited by the level of a power source voltage. That is, the polar transmitter has a small dynamic range. Therefore, the polar transmitter is used in communication systems such as Global System for Mobile Communications (GSM) systems in which an amplitude signal of a TX signal is constant or an output dynamic range is small. However, the use of the polar transmitter is restricted in communication systems such as Wideband Code Division Multiple Access (WCDMA) systems that have a high dynamic range. Thus, a WCDMA direct-conversion transmitter uses a class-AB or class-A linear power amplifier. However, due to its low power efficiency, the linear power amplifier requires a higher power consumption than the switching power amplifier.

SUMMARY OF THE INVENTION

A polar transmitter using a switching power amplifier has a high power efficiency but has a small dynamic range. Thus, the polar transmitter can be used only in communication systems such as GSM systems in which an amplitude signal of a TX signal is constant or an output dynamic range is small, but the use of the polar transmitter is restricted in communication systems such as WCDMA systems that have a large dynamic range.

The communication system with a large dynamic range uses, instead of the polar transmitter, a direct-conversion transmitter that uses a class-AB or class-A linear power amplifier. However, the linear power amplifier requires a high power consumption due to its low power efficiency.

Therefore, the present invention provides a transmitter and a transmitting method thereof that can support both the high power efficiency (i.e., the advantage of the switching power amplifier) and the high dynamic range (i.e., the advantage of the linear power amplifier).

Embodiments of the present invention provide transmitters including: a transmission circuit operating as one of a polar transmitter and a direct-conversion transmitter; and a control circuit controlling an operation of the transmission circuit according to the level of an output signal.

In some embodiments, the transmission circuit operates as the polar transmitter when the output signal level is equal to or higher than a medium-power level, and operates as the direct conversion transmitter when the output signal level is lower than the medium-power level.

In other embodiments, the transmission circuit includes: a baseband processor generating an analog baseband signal; a phase signal generator generating a phase signal in response to the baseband signal; an amplitude signal generator generating an amplitude signal in response to the baseband signal; a power amplifier generating the output signal in response to at lease one of the phase signal and the amplitude signal, a class type of the power amplifier being controlled by the control circuit; and an analog-to-digital converter feeding the output signal back to the control circuit.

In further embodiments, the power amplifier operates as a switching power amplifier with a high power efficiency when the transmitter operates as the polar transmitter.

In still further embodiments, the power amplifier operates as a class-E nonlinear power amplifier when the transmitter operates as the polar transmitter.

In still further embodiments, the power amplifier operates as a high-linearity power amplifier with a high dynamic range when the transmitter operates as the direct-conversion transmitter.

In still further embodiments, the power amplifier operates as one of a class-A linear power amplifier and a class-AB linear power amplifier when the transmitter operates as the direct-conversion transmitter.

In still further embodiments, the amplitude signal generator includes: an analog I/Q combiner combining an I(t) signal and a Q(t) signal of the baseband signal to generate a first amplitude signal; and an amplitude modulator modulating the first amplitude signal to output the amplitude signal.

In still further embodiments, the phase signal generator includes: an upconversion mixer mixing a local oscillation signal and the baseband signal for frequency upconversion; and an RF signal combiner/limiter combining the output of the upconversion mixer into an RF signal that has a constant amplitude and carries only a phase signal.

In still further embodiments, the RF signal combiner/limiter operates as a signal combiner and a limiter when the transmission circuit operates as the polar transmitter according to the control of the control circuit, and operates as the signal combiner when the transmission circuit operates as the direct-conversion transmitter.

In still further embodiments, the amplitude signal generator, the analog-to-digital converter, and the limiter are disabled according to the control of the control circuit when the transmission circuit operates as the direct-conversion transmitter.

In still further embodiments, the control circuit includes a time mismatch compensator compensating a time mismatch between the amplitude signal and the phase signal in response to the fed-back output signal.

In still further embodiments, the time mismatch compensator is disabled according to the control of the control circuit when the transmission circuit operates as the direct-conversion transmitter.

In other embodiments of the present invention, transmitting methods include: determining an operation mode depending on the level of an output signal; and controlling a transmission circuit to operate as one of a polar transmitter and a direct-conversion transmitter according to the determined operation mode.

In some embodiments, the transmission circuit operates as the polar transmitter when the output signal level is equal to or higher than a medium-power level, and operates as the direct conversion transmitter when the output signal level is lower than the medium-power level.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

A mobile transmitter according to the present invention operates as a direct-conversion transmitter using a linear power amplifier with a high dynamic range when it transmits a low-power signal. Also, the mobile transmitter operates as a polar transmitter using a switching power amplifier with a high power efficiency when it transmits a medium-power or high-power signal. Thus, the mobile transmitter according to the present invention can provide both the high power efficiency (i.e., the advantage of the switching power amplifier) and the high dynamic range (i.e., the advantage of the linear power amplifier) by means of a single transmitter structure.

Hereinafter, exemplary embodiments of the present invention will be described in detail with reference to the accompanying drawings.

Figure 1:
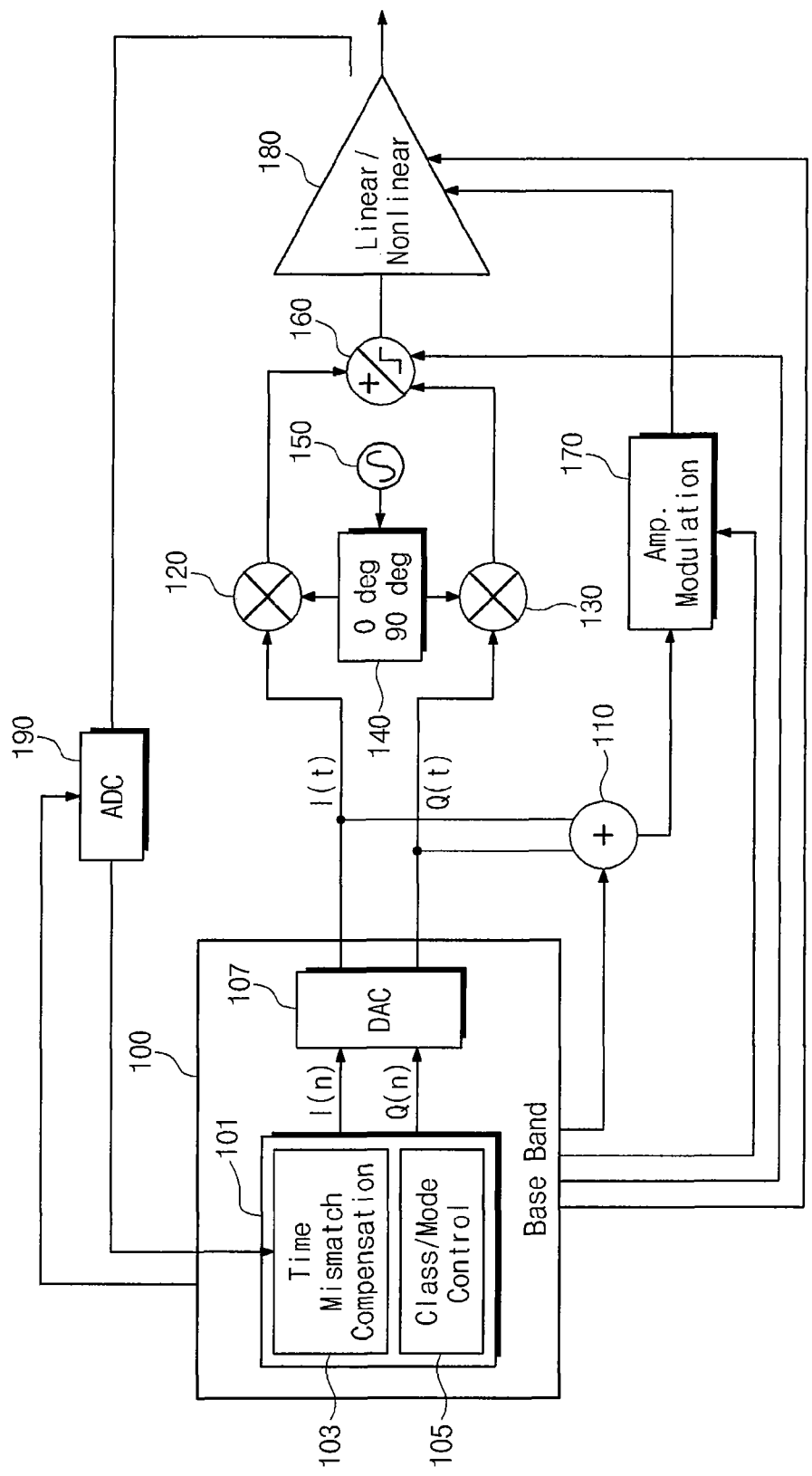
FIG. 1 is a block diagram of a mobile transmitter according to an embodiment of the present invention.

FIG. 1 is a block diagram of a mobile transmitter according to an embodiment of the present invention. The mobile transmitter is configured to operate as a direct-conversion transmitter or a polar transmitter depending on the level of output power.

Referring to FIG. 1, the transmitter includes a baseband processor 100, an analog inphase/quadrature (I/Q) combiner 110, an I-upconversion mixer 120, a Q-upconversion mixer 130, a 90° phase shifter 140, a local oscillator 150, an RF signal combiner/limiter 160, an amplitude modulator 170, a class-controllable power amplifier 180, and an analog-to-digital converter (ADC) 190.

The baseband processor 100 includes a controller 101 and a digital-to-analog converter (DAC) 107. The controller 101 includes a time mismatch compensator 103 and a class/mode controller 105. Based on the level of output power, the class/mode controller 105 determines whether to operate the mobile transmitter as a polar transmitter or a direct-conversion transmitter. According to the determination result, the class/mode controller 105 transmits a class/mode control signal to the ADC 190, the analog I/Q combiner 110, the RF signal combiner/limiter 160, the amplitude modulator 170, and the power amplifier 180. The time mismatch compensator 103 compensates a time mismatch between a phase signal and an amplitude signal (i.e., a time mismatch between a phase signal path and an amplitude signal path) in response to a fed-back Output RF signal. A portion of an Output RF signal of the mobile transmitter is converted into a digital signal by the ADC 190, and the digital signal is fed back to the baseband processor 100, which will be described later. Hereinafter, an operation of the mobile transmitter will be described in detail with reference to FIGS. 2 and 3.

Figure 2:
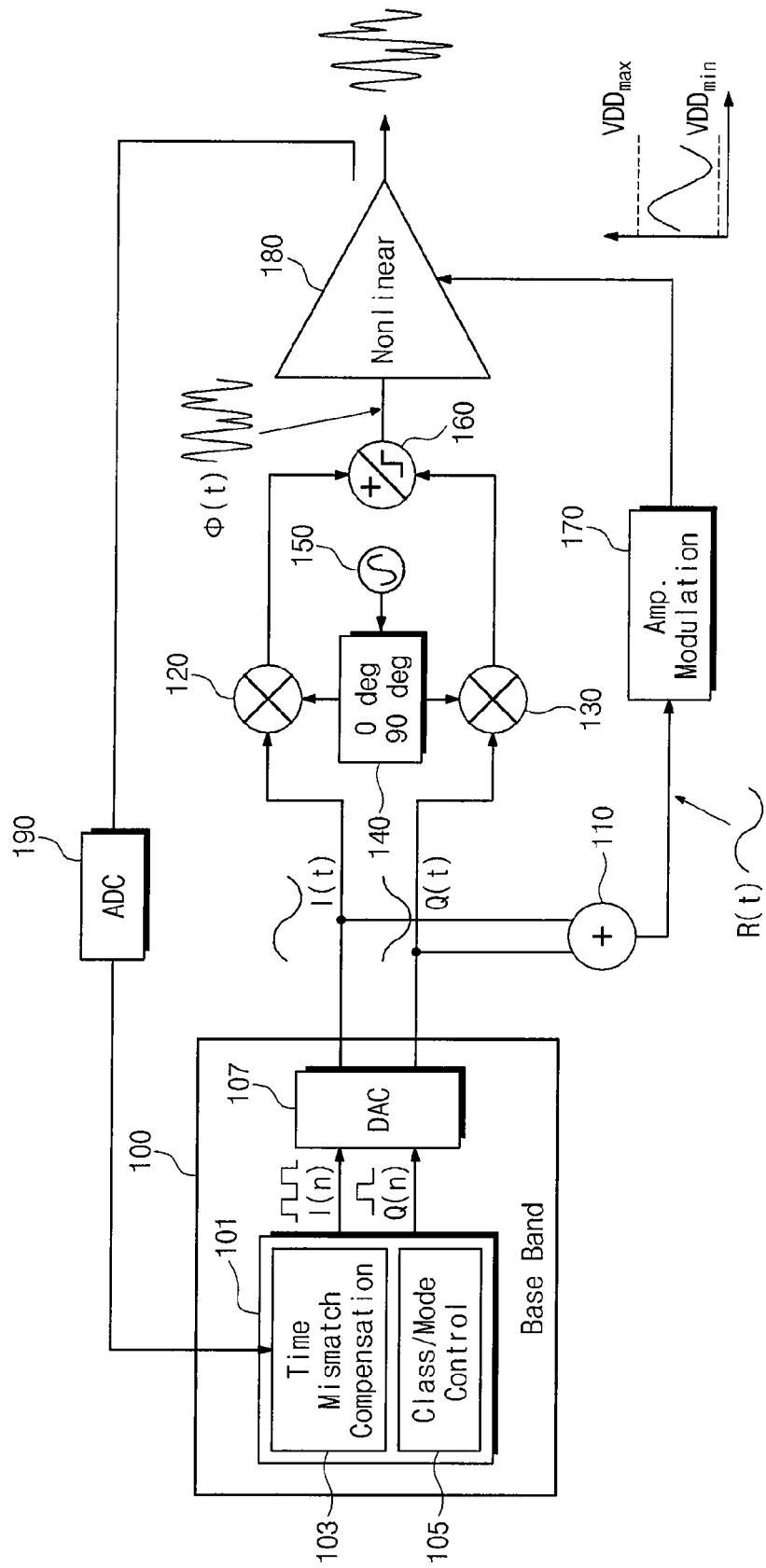
FIG. 2 illustrates that the mobile transmitter of FIG. 1 operates as a polar transmitter in a medium-power/high-power output mode.

FIG. 2 illustrates that the mobile transmitter of FIG. 1 operates as a polar transmitter in a medium-power/high-power output mode.

Referring to FIG. 2, based on the level of output power, the class/mode controller 105 of the baseband processor 100 determines whether to operate the mobile transmitter as a polar transmitter or a direct-conversion transmitter. According to the determination result, the class/mode controller 105 generates and transmits a class/mode control signal to the ADC 190, the analog I/Q combiner 110, the RF signal combiner/limiter 160, the amplitude modulator 170, and the power amplifier 180.

For example, in case of a medium-power/high-power output mode, the mobile transmitter operates as a polar transmitter in response to the class/mode control signal generated by the class/mode controller 105. In this case, the power amplifier 180 operates as a switching power amplifier with a high power efficiency (e.g., a class-E nonlinear power amplifier). On the other hand, in case of a low-power output mode, the mobile transmitter operates as a direct-conversion transmitter in response to the class/mode control signal generated by the class/mode controller 105. In this case, the power amplifier 180 operates as a linear power amplifier with a high dynamic range. In this manner, the power amplifier 180 operates as a nonlinear power amplifier or a linear power amplifier depending on the level of an output signal. The case where the power amplifier 180 operates as a linear power amplifier with a high dynamic range will be described later with reference to FIG. 3.

In an operation mode of the mobile transmitter, digital baseband signals I(n) and Q(n) are generated in the baseband processor 100 under the control of the controller 101. The generated digital baseband signals I(n) and Q(n) are converted into analog baseband signals I(t) and Q(t) by the DAC 107. The analog baseband signal I(t) is input to the I-upconversion mixer 120, while the analog baseband signal Q(t) is input to the Q-upconversion mixer 130. The I-upconversion mixer 120/the Q-upconversion mixer 130 performs frequency upconversion by 10 mixing the analog baseband signal I(t)/Q(t) with a local oscillation (LO) signal received from the local oscillator 150/the 90° phase shifter 140. The upconverted RF signals are combined by the RF signal combiner/limiter 160 into an RF signal that has a constant amplitude and carries a phase signal. Consequently, the RF signal combiner/limiter 160 outputs a phase signal θ(t). The phase signal θ(t) is input to a signal input unit of the power amplifier 180. As described above, the I-upconversion mixer 120, the Q-upconversion mixer 130, the 90° phase shifter 140, the local oscillator 150, and the RF signal combiner/limier 160 function as a phase signal generation circuit for generating the phase signal θ(t). The signal path of the phase signal generation circuit corresponds to a phase signal path for processing the phase signal θ(t).

The analog baseband signals I(t) and Q(t) output from the baseband processor 100 are combined into an amplitude signal R(t) by the analog I/Q combiner 110. The amplitude signal R(t) output from the analog I/Q combiner 110 is amplitude-modulated by the amplitude modulator 170. The amplitude-modulated amplitude signal R(t) is input to a bias circuit of the power amplifier 180. The amplitude signal R(t) input to the power amplifier 180 is used to control the output level of the power amplifier 180. As described above, the analog I/Q combiner 110 and the amplitude modulator 170 function as an amplitude signal generation circuit for generating the amplitude signal R(t). The signal path of the amplitude signal generation circuit corresponds to a phase signal path for processing the amplitude signal R(t).

The power amplifier 180 receives the phase signal θ(t)/the amplitude signal R(t) from the phase signal path/the amplitude signal path to output an RF signal resulting from the combination of the phase signal θ(t) and the amplitude signal R(t). A time mismatch between an amplitude signal and a phase signal of the output RF signal from the power amplifier 180 is compensated through feedback. That is, a portion of the output RF signal from the power amplifier 180 is converted into a digital signal by the ADC 190, and the digital signal is fed back to the baseband processor 100. The baseband processor 100 compensates a time mismatch between the phase signal path and the amplitude signal path by means of the time mismatch compensator 103. After the time mismatch is compensated, the class/mode controller 105 transmits a class/mode control signal to the corresponding units of the mobile transmitter.

Figure 3:
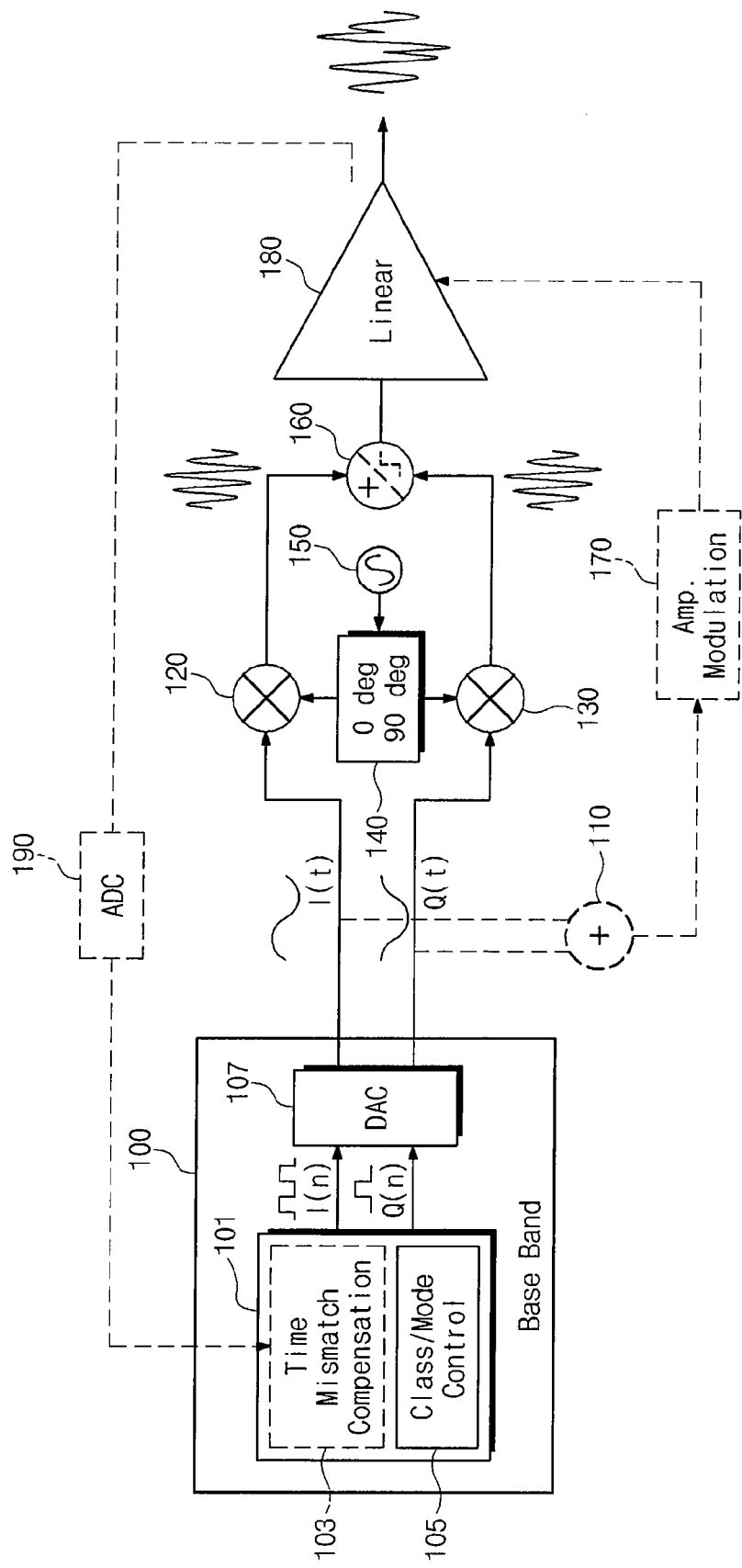
FIG. 3 illustrates that the mobile transmitter of FIG. 1 operates as a direct-conversion transmitter in a low-power output mode.

FIG. 3 illustrates that the mobile transmitter of FIG. 1 operates as a direct-conversion transmitter in a low-power output mode.

Referring to FIG. 3, in case of low-power output mode, the mobile transmitter operates as a direct-conversion transmitter. In this case, using a class/mode control signal, the class/mode controller 105 of the baseband processor 100 interrupts the operations of the ADC 190, the analog I/Q combiner 110, the amplitude modulator 170, and the power amplifier 180 and interrupts the function of the RF signal combiner/limiter 160. In this case, the RF signal combiner/limiter 160 operates only as a combiner without a limiter function. The units of the mobile transmitter, which do not operate when the mobile transmitter operates as a direct-conversion transmitter, are represented by dotted lines in FIG. 3.

In the low-power output mode, an analog baseband signal I(t)/Q(t) output from the baseband processor 100 is input to the I-upconversion mixer 120/the Q-upconversion mixer 130. The I-upconversion mixer 120/the Q-upconversion mixer 130 performs frequency upconversion by mixing the analog baseband signal I(t)/Q(t) with a local oscillation (LO) signal received from the local oscillator 150/the 90° phase shifter 140. The upconverted RF signals are combined by the RF signal combiner/limiter 160 into an RF signal. In this case, the power amplifier 180 operates as a class-AB or class-A linear power amplifier with a large dynamic range. Unlike the polar transmitter, the direct-conversion transmitter does not generate a time mismatch between the amplitude signal path and the phase signal path because it does not process an amplitude signal R(t) and a phase signal θ(t) in a separate manner. Thus, the output of the power amplifier 180 is not fed back to the baseband processor 180.

It can be seen that, when the mobile transmitter of the present invention operates as a direct-conversion transmitter as described above, its transmission scheme is identical to that of a conventional direct-conversion transmitter. An example of the transmission scheme of the conventional direct-conversion transmitter is disclosed in U.S. Pat. No. 7,209,526 entitled "APPARATUS AND METHOD FOR DETECTING I/Q CHANNEL IMBALANCE IN DIRECT CONVERSION DIGITAL QUADRATURE TRANSMISSION SYSTEM" and issued to Kim et al. on Apr. 24, 2007.

Figure 4:
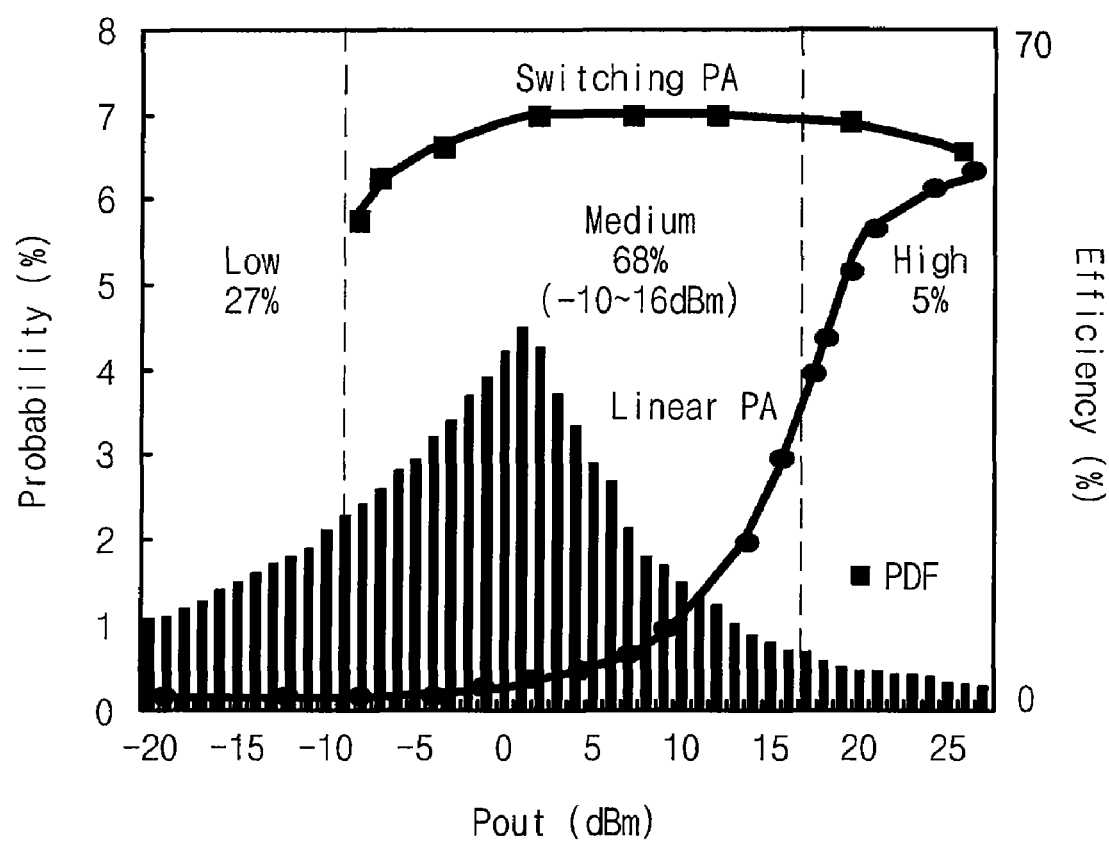
FIG. 4 is a graph illustrating the probability distribution of the TX power of a WCDMA scheme and the efficiencies for the respective operation modes of the power amplifier.

FIG. 4 is a graph illustrating the probability distribution of the TX power of a WCDMA scheme and the efficiencies for the respective operation modes of the power amplifier. With reference to FIG. 4, a description will be given of the fact that the dynamic range is improved by the class control when the mobile transmitter of the present invention is used in the WCDMA scheme.

Referring to FIG. 4, an output power level range of about −10 dBm or lower is defined as a low-power transmission range, an output power level range of from about −10 dBm to about 16 dBm is defined as a medium-power transmission range, and an output power level range of about 16 dBm or higher is defined as a high-power transmission range. The transmission probability of the low-power transmission range is 27%, the transmission probability of the medium-power transmission range is 68%, and the transmission probability of the high-power transmission range is 5%. That is, it can be seen that the medium-power transmission range has the highest transmission probability.

A typical linear power amplifier (denoted by "Linear PA" in FIG. 4) has a wide output dynamic range allowing transmission in all the three transmission ranges, and has a high power efficiency in the high-power transmission range. However, the typical linear power amplifier has a very-low power efficiency in the medium-power transmission with the highest transmission probability.

On the other hand, the mobile transmitter of the present invention (denoted by "Switching PA" in FIG. 4) operates as a direct-conversion transmitter using a class-AB or class-A linear power amplifier in the low-power transmission range, thereby having a high dynamic range in the low-power transmission range. Also, the mobile transmitter of the present invention operates a polar transmitter using a switching power amplifier in the medium-power/high-power transmission range. For example, a class-E linear power amplifier may be used as the switching power amplifier. In the medium-power/high-power transmission range, the switching power amplifier has a relatively small dynamic range but has a higher power efficiency than the linear power amplifier. Thus, when the mobile transmitter operates as a direct-conversion transmitter or a polar transmitter depending on the TX mode, it is possible to provide a high power efficiency in the medium-power transmission with the high transmission probability while maintaining a high dynamic range. Therefore, it is possible to implement a mobile transmitter with a high overall efficiency.

As described above, the present invention provides a mobile transmitter that can selectively operate as a polar transmitter using a switching power amplifier or a direct-conversion transmitter using a linear power amplifier. The mobile transmitter according to the present invention operates as a polar transmitter with a high power efficiency when it transmits an RF signal with a large dynamic range of 80 dB or higher as in the personal portable communication standard such as WCDMA (i.e., in the medium-power/high-power output mode). In this case, the power amplifier of the mobile transmitter according to the present invention operates as a switching power amplifier such as a class-E nonlinear power amplifier. Also, the mobile transmitter according to the present invention operates as a direct-conversion transmitter in the low-power output mode. In this case, the power amplifier of the mobile transmitter according to the present invention operates as a class-AB or class-A linear power amplifier. Consequently, the mobile transmitter according to the present invention can provide both the high power efficiency (i.e., the advantage of the switching power amplifier) and the high dynamic range (i.e., the advantage of the linear power amplifier). These advantages make it possible to increase the battery lifetime of a personal portable communication terminal and also to implement to a compound terminal that can support a variety of communication standards with a high dynamic range.

As described above, the mobile transmitter according to the present invention operates as a direct-conversion transmitter using a linear power amplifier with a high dynamic range when it transmits a low-power signal. Also, the mobile transmitter operates as a polar transmitter using a switching power amplifier with a high power efficiency when it transmits a medium-power or high-power signal. Thus, the mobile transmitter according to the present invention can provide both the high power efficiency (i.e., the advantage of the switching power amplifier) and the high dynamic range (i.e., the advantage of the linear power amplifier). Consequently, it possible to increase the battery lifetime of a personal portable communication terminal and also to implement to a compound terminal that can satisfy a variety of communication standards with a high dynamic range.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A transmitter comprising:
    a transmission circuit configured to operate as one of a polar transmitter and a direct conversion transmitter; and
    a control circuit configured to control an operation of the transmission circuit according to a power level of an output signal a baseband processor configured to generate an analog baseband signal; a phase signal generator configured to generate a phase signal in response to the baseband signal; an amplitude signal generator configured to generate an amplitude signal in response to the baseband signal; a power amplifier configured to generate the output signal in response to at least one of the phase signal and the amplitude signal, a class type of the power amplifier being controlled by the control circuit; and an analog-to-digital converter configured to feed the output signal back to the control circuit.

2. The transmitter of claim 1, wherein the transmission circuit operates as the polar transmitter when the output signal level is equal to or higher than a medium-power level, and operates as the direct conversion transmitter when the output signal level is lower than the medium-power level.

3. The transmitter of claim 1, wherein the power amplifier is configured to operate as a switching power amplifier with a high power efficiency when the transmitter operates as the polar transmitter.

4. The transmitter of claim 1, wherein the power amplifier is configured to operate as a class-E nonlinear power amplifier when the transmitter operates as the polar transmitter.

5. The transmitter of claim 1, wherein the power amplifier is configured to operate as a high-linearity power amplifier with a high dynamic range when the transmitter operates as the direct-conversion transmitter.

6. The transmitter of claim 1, wherein the power amplifier is configured to operate as one of a class-A linear power amplifier and a class-AB linear power amplifier when the transmitter operates as the direct-conversion transmitter.

7. The transmitter of claim 1, wherein the amplitude signal generator comprises:
    an analog I/Q combiner configured to combine a I(t) signal and a Q(t) signal of the baseband signal to generate a first amplitude signal; and
    an amplitude modulator configured to modulate the first amplitude signal to output the amplitude signal.

8. The transmitter of claim 1, wherein the phase signal generator comprises:
    an upconversion mixer configured to mix a local oscillation signal and the baseband signal for frequency upconversion; and
    an RF signal combiner/limiter configured to combine the output of the up conversion mixer into an RF signal that has a constant amplitude and carries only a phase signal.

9. The transmitter of claim 8, wherein the RF signal combiner/limiter is configured to operate as a signal combiner and a limiter when the transmission circuit operates as the polar transmitter according to the control of the control circuit, and operate as the signal combiner when the transmission circuit operates as the direct-conversion transmitter.

10. The transmitter of claim 9, wherein the amplitude signal generator, the analog-to-digital converter, and the limiter are disabled according to the control of the control circuit when the transmission circuit operates as the direct-conversion transmitter.

11. The transmitter of claim 1, wherein the control circuit further comprises a time mismatch compensator configured to compensate a time mismatch between the amplitude signal and the phase signal in response to the fed-back output signal.

12. The transmitter of claim 11, wherein the time mismatch compensator is disabled according to the control of the control circuit when the transmission circuit operates as the direct-conversion transmitter.

13. A transmitting method comprising:
    determining an operation mode depending on a power level of an output signal; and
    controlling a transmission circuit to operate as one of a polar transmitter and a direct-conversion transmitter according to the operation mode wherein the transmission circuit is configured to perform steps of: generating an analog baseband signal; generating a phase signal in response to the analog baseband signal; generating an amplitude signal in response to the baseband signal; generating, using a power amplifier, the output signal in response to at least one of the phase signal and the amplitude signal, a class type of the power amplifier being determined in response to the operation mode; and determining the operation mode using the output signal.

14. The transmitting method of claim 13, wherein the transmission circuit is configured to operate as the polar transmitter when the output signal level is equal to or higher than a medium-power level, and operate as the direct conversion transmitter when the output signal level is lower than the medium-power level.

15. The transmitting method of claim 13, wherein when the transmission circuit operates as the polar transmitter, a power amplifier of the transmission circuit is configured to operate as a switching power amplifier with a high power efficiency.

16. The transmitting method of claim 13, wherein when the transmission circuit operates as the polar transmitter, a power amplifier of the transmission circuit is configured to operate as a class-E nonlinear power amplifier.

17. The transmitting method of claim 13, wherein when the transmission circuit operates as the direct-conversion transmitter, a power amplifier of the transmission circuit is configured to operate as a high-linearity power amplifier with a high dynamic range.

18. The transmitting method of claim 13, wherein when the transmission circuit operates as the direct-conversion transmitter, a power amplifier of the transmission circuit is configured to operate as one of a class-A linear power amplifier and a class-AB linear power amplifier.

* * * * *